United States Patent
Kuo

(10) Patent No.: US 7,446,539 B2
(45) Date of Patent: Nov. 4, 2008

(54) IDENTIFYING APPARATUS FOR AC POWER SUPPLY ARRANGEMENT

(75) Inventor: Heng-Chen Kuo, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/556,202

(22) Filed: Nov. 3, 2006

(65) Prior Publication Data

US 2008/0024138 A1    Jan. 31, 2008

(30) Foreign Application Priority Data

Jul. 27, 2006   (CN) .................. 2006 1 0200751.3

(51) Int. Cl.
*G01R 31/08*   (2006.01)
*H02H 3/00*   (2006.01)

(52) U.S. Cl. .......................... 324/522; 361/42

(58) Field of Classification Search ............ 324/522, 324/512, 500, 66, 107; 361/42, 45, 46, 49, 361/50, 79, 80, 86, 92; 700/286, 292, 293
See application file for complete search history.

(56) References Cited

U.S. PATENT DOCUMENTS

| | | | |
|---|---|---|---|
| 4,432,030 A * | 2/1984 | Briccetti ..................... 361/92 |
| 5,606,480 A * | 2/1997 | Nevo ............................ 361/46 |
| 5,706,155 A * | 1/1998 | Neiger et al. .................. 361/45 |
| 5,737,168 A | 4/1998 | Baker |
| 6,121,695 A * | 9/2000 | Loh .............................. 307/64 |
| 6,807,035 B1 * | 10/2004 | Baldwin et al. ................ 361/42 |
| 6,956,726 B2 * | 10/2005 | Hsu et al. ...................... 361/42 |
| 6,958,895 B1 * | 10/2005 | Radosavljevic et al. ....... 361/42 |
| 6,975,491 B2 * | 12/2005 | Silverman ..................... 361/42 |
| 7,133,266 B1 * | 11/2006 | Finlay .......................... 361/42 |
| 7,136,267 B2 * | 11/2006 | Silverman ..................... 361/42 |
| 7,239,491 B1 * | 7/2007 | Morgan et al. ................ 361/42 |
| 7,292,419 B1 * | 11/2007 | Nemir .......................... 361/42 |
| 2003/0147192 A1 | 8/2003 | Crocker |
| 2006/0126244 A1 | 6/2006 | Hon Hai |

FOREIGN PATENT DOCUMENTS

| CN | 1514529 A | 7/2004 |
|---|---|---|
| CN | 1787308 A | 6/2006 |

* cited by examiner

*Primary Examiner*—Vincent Q. Nguyen
*Assistant Examiner*—Hoai-An D Nguyen
(74) *Attorney, Agent, or Firm*—Wei Te Chung

(57) ABSTRACT

An identifying apparatus for an arrangement of an alternating current (AC) power supply includes a detecting circuit and a control circuit. The AC power supply includes a hot line and a neutral line. The detecting circuit is electrically coupled to the hot line and the neutral line of the AC power supply. The AC power supply supplies power to an electronic device via the control circuit. The detecting circuit detects connection status of the hot line and the neutral line of the AC power supply and generates a detection signal to the control circuit. If the hot line and the neutral line are swapped, the control circuit prevents the AC power supply from supplying power to the electronic device.

16 Claims, 2 Drawing Sheets

IDENTIFYING APPARATUS FOR AC POWER SUPPLY ARRANGEMENT

BACKGROUND OF THE INVENTION

1. Field of the Invention

The present invention relates to power arrangement identification, and particularly to an apparatus for identifying an arrangement of an alternating current (AC) power supply.

2. Description of Related Art

Conventionally, power supplies for electronic device employ a three-line AC configuration. Generally, a "hot line" and a "neutral line" of AC electric wiring are used to provide power, and a "ground line" thereof is connected to ground, protecting users from being electrocuted. However, mis-wiring may occur when the wiring is installed improperly in homes, offices etc. For example, swapping of the hot and neutral lines in the wall socket, which can be very hazardous.

What is desired, therefore, is to provide an identifying apparatus which can effectively protect electronic device and users when hot and neutral lines of AC electric wiring are swapped.

SUMMARY OF THE INVENTION

An exemplary identifying apparatus for an arrangement of an alternating current (AC) power supply includes a detecting circuit and a control circuit. The AC power supply includes a hot line and a neutral line. The detecting circuit is electrically coupled to the hot line and the neutral line of the AC power supply. The AC power supply supplies power to an electronic device via the control circuit. The detecting circuit detects connection status of the hot line and the neutral line of the AC power supply and generates a detection signal to the control circuit. If the hot line and the neutral line are swapped, the control circuit prevents the AC power supply from supplying power to the electronic device.

Other advantages and novel features will become more apparent from the following detailed description when taken in conjunction with the accompanying drawings, in which:

DETAILED DESCRIPTION OF THE INVENTION

Figure 1:
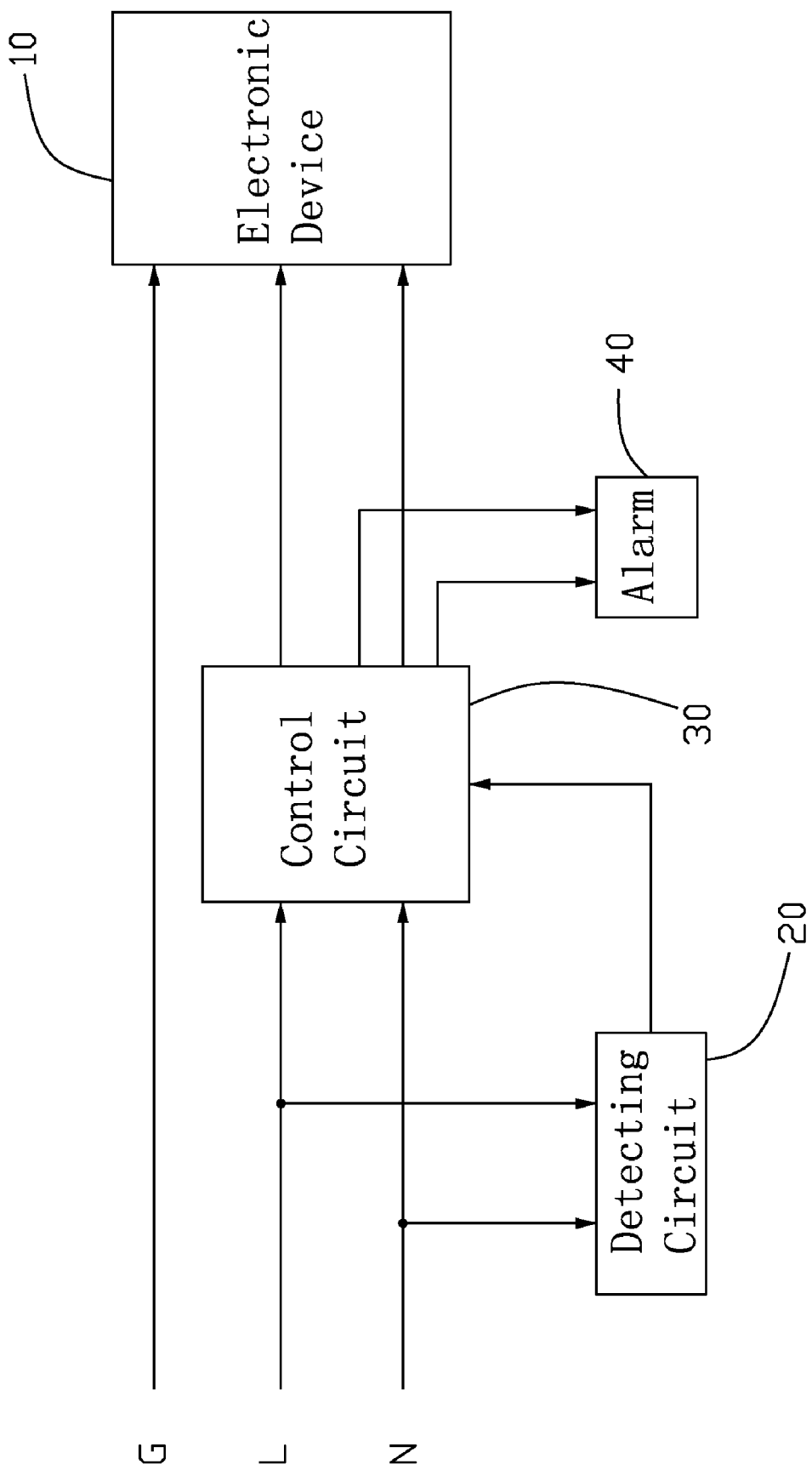
FIG. 1 is a block diagram of an identifying apparatus for an AC power supply arrangement in accordance with a preferred embodiment of the present invention, together with an electronic device.

Referring to FIG. 1, an identifying apparatus in accordance with a preferred embodiment of the present invention for an AC power supply arrangement is provided for protecting an electronic device 10 supplied power from an AC power supply. The electronic device 10 can be, for example, a television, a computer, a refrigerator, etc. The identifying apparatus includes a detecting circuit 20, a control circuit 30, and an alarm 40. The electronic device 10 is coupled to a hot line L and a neutral line N of the AC power supply via the control circuit 30, and directly coupled to a ground line G of the AC power supply. The detecting circuit 20 is coupled to the hot line L and the neutral line N of the AC power supply, and detects a voltage level therebetween and generates a detection signal to the control circuit 30. The alarm 40 is coupled to the control circuit 30. When the hot line L and the neutral line N of the AC power supply are swapped, the control circuit 30 cuts off power from the AC power supply to the electronic device 10 according to the detection signal, and the alarm 40 activates to indicate the mis-wiring condition of the AC power supply for users.

Figure 2:
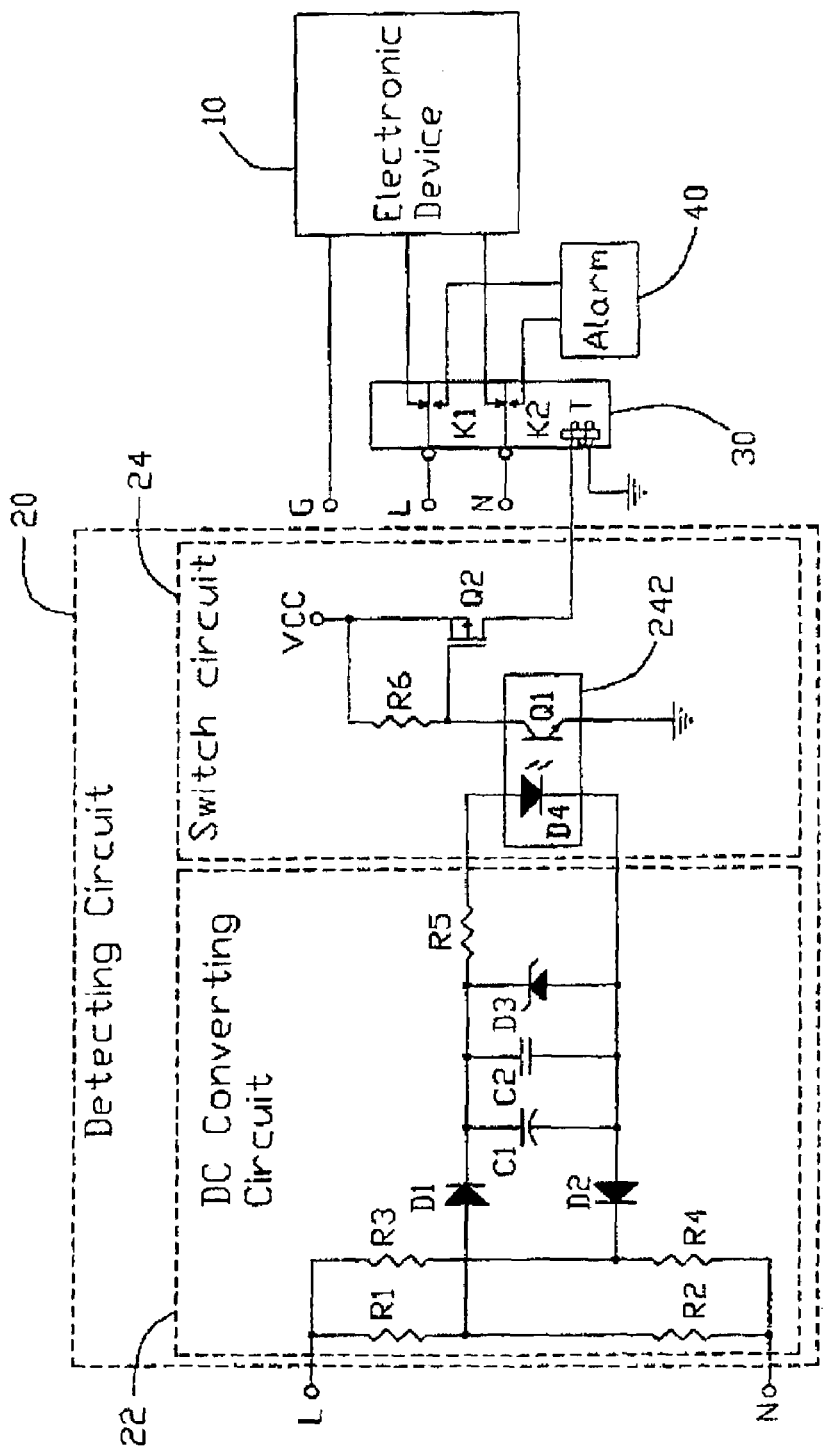
FIG. 2 is a circuit diagram of FIG. 1.

FIG. 2 shows a detailed circuit diagram of FIG. 1. The detecting circuit 20 includes a direct current (DC) converting circuit 22, and a switch circuit 24. The converting circuit 22 includes a voltage comparing circuit having a first resistor R1, a second resistor R2, a third resistor R3, and a fourth resistor R4; a rectifier circuit having two diodes D1 and D2; a filter circuit having two capacitors C1 and C2; a regulator circuit having a zener diode D3; and a fifth resistor R5. The first resistor R1 and second resistor R2 are electrically connected between the hot line L and the neutral line N in series. The third resistor R3 and fourth resistor R4 are also electrically connected between the hot line L and the neutral line N in series. A junction between the first resistor R1 and second resistor R2 and a junction between the third resistor R3 and fourth resistor R4 are respectively electrically connected to an anode of the diode D1 and a cathode of the diode D2 of the rectifier circuit, a cathode of the diode D1 is electrically connected to an end of the fifth resistor R5. The capacitors C1, C2, and the zener diode D3 are electrically coupled between the cathode of the diode D1 and an anode of the diode D2 in parallel in turn. An anode of the zener diode D3 is connected to the anode of the diode D2, and a cathode of the zener diode D3 is connected to the cathode of the diode D1. In this embodiment, a resistance of the first resistor R1 and a resistance of the fourth resistor R4 are equal. A resistance of the second resistor R2 and a resistance of the third resistor R3 are equal. The resistance of the first resistor R1 is greater than the resistance of the second resistor R2. Because a voltage value of the hot line L is greater than that of the neutral line N, when the hot line L and neutral line N of the AC power supply are swapped, a voltage value of the junction between the first resistor R1 and second resistor R2 is greater than that of the junction between the third resistor R3 and fourth resistor R4, so the DC converting circuit 22 will generate a DC signal between the other end of the fifth resistor R5 and the anode of the diode D2.

The switch circuit 24 includes a photocoupler 242 having a light-emitting diode (LED) D4 and a phototransistor Q1, a transistor Q2, a resistor R6, and a direct current (DC) power source VCC. The other end of the fifth resistor R5 and the anode of the diode D2 of the converting circuit 22 are respectively electrically coupled to an anode and a cathode of the LED D4. An emitter of the phototransistor Q1 is grounded, a collector of the phototransistor Q1 is electrically coupled to the DC power source VCC via the resistor R6, and the collector of the phototransistor Q1 is also electrically coupled to a gate of the transistor Q2. A source of the transistor Q2 is electrically coupled to the DC power source VCC.

The control circuit 30 includes a relay having an inductance coil T, and two single-pole double-throw (SPDT) switches K1 and K2. A drain of the transistor Q2 of the switch circuit 24 is electrically coupled to one terminal of the inductance coil T. The other terminal of the inductance coil T is grounded. The hot line L and the neutral line N are electrically coupled to the corresponding power terminals of the electronic device 10 via one contact of the SPDT switch K1 and one contact of the SPDT switch K2 respectively. The alarm 40 is electrically coupled to the other contact of the SPDT switch K1 and the other contact of the SPDT switch K2. When the inductance coil T is turned on, the hot line L and the neutral line N are converted to connect to the alarm 40.

When the electronic device 10 is supplied with power from the AC power supply via the identifying apparatus, if the hot line L, and the neutral line N of the AC power supply are arranged correctly, the converting circuit 22 will not output a DC power signal to the switch circuit 24 because of the relationships of the resistances of first resistor R1, the second resistor R2, the third resistor R3, and the fourth resistor R4, thereby the photocoupler 242 is not turned on, so that the electronic device 10 will work normally. If the hot line L and the neutral line N of AC power supply are swapped, the converting circuit 22 will output a DC power signal to the switch circuit 24, thereby the photocoupler 242 is turned on, namely the phototransistor Q1 of the photocoupler 242 is turned on. Thus, the transistor Q2 is turned on, then the inductance coil T is turned on, and then the hot line L and the neutral line N are converted to electrically connect to the alarm 40, thereby the alarm 40 will work to indicate the mis-wiring condition of the AC power supply, and power to the electronic device 10 will be stopped. The alarm 40 can also be replaced by other indicators, such as an LED according to need.

Thus, if mis-wiring of the AC power supply occurs, it can be identified with exemplary embodiments, avoiding damage to individuals and electronic devices. The identifying apparatus can be installed in electronic devices, or installed in a box individually according to need.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. An identifying apparatus for a wiring arrangement of an alternating current (AC) power supply, the AC power supply comprising a hot line and a neutral line, the identifying apparatus comprising:
    a detecting circuit electrically coupled to the hot line and the neutral line of the AC power supply for detecting a voltage level between the hot line and the neutral line and generating a detection signal; and
    a control circuit comprising a relay having an inductance coil, and two single-pole double-throw (SPDT) switches, the detecting circuit electrically coupled to one terminal of the inductance coil, the other terminal of the inductance coil being grounded, the hot line and the neutral line electrically coupled to the corresponding power terminals of the electronic device via one contact of one of the SPDT switches and one contact of the other one of the SPDT switches respectively, the AC power supply supplying power to an electronic device via the control circuit, the control circuit coupled to the detecting circuit for receiving the detection signal of the detecting circuit, if the hot line and the neutral line are swapped, the control circuit preventing the AC power supply from supplying power to the electronic device.

2. The identifying apparatus as claimed in claim 1, wherein the detecting circuit includes a direct current (DC) converting circuit, and a switch circuit electrically connected to the converting circuit, if the hot line and the neutral line are swapped, the converting circuit outputs a DC signal to the switch circuit, and the switch circuit outputs the detection signal in response to the DC signal to the control circuit so that the control circuit stops the AC power supply to supply power to the electronic device.

3. The identifying apparatus as claimed in claim 2, wherein the converting circuit includes a voltage comparing circuit, a rectifier circuit, a filter circuit, and a regulator circuit, the hot line and the neutral line are electrically connected to the switch circuit via the voltage comparing circuit, the rectifier circuit, the filter circuit, and the regulator circuit in turn.

4. The identifying apparatus as claimed in claim 3, wherein the voltage comparing circuit includes a first resistor, a second resistor, a third resistor, and a fourth resistor, the first and second resistors are electrically connected between the hot line and the neutral line in series, the third and fourth resistors are electrically connected between the hot line and the neutral line in series, a junction between the first and second resistors and a junction between the third and fourth resistors are electrically connected to the rectifier circuit.

5. The identifying apparatus as claimed in claim 4, wherein a resistance of the first resistor and a resistance of the fourth resistor are equal, a resistance of the second resistor and a resistance of the third resistor are equal, the resistance of the first resistor is greater than the resistance of the second resistor.

6. The identifying apparatus as claimed in claim 2, wherein the switch circuit includes a photocoupler, a transistor, and a DC power source, the converting circuit is electrically coupled to the DC power source and a gate of the transistor via the photocoupler, a source of the transistor is electrically coupled to the DC power source, a drain of the transistor is electrically coupled to the control circuit.

7. The identifying apparatus as claimed in claim 1, further comprising an alarm electrically coupled to the other contacts of the SPDT switches.

8. An identifying apparatus for a wiring arrangement of an alternating current (AC) power supply comprising:
    a detecting circuit for detecting a voltage level between a hot line and a neutral line to generate a detection signal, comprising:
        a direct current (DC) converting circuit coupled between the hot line and the neutral line of the AC power supply for receiving a power signal of the AC power supply, if the hot line and the neutral line are swapped, the DC converting circuit generating a DC signal: and
        a switch circuit electrically connected to the converting circuit for receiving the DC signal and generating the detection signal in response to the DC signal; and
    a control circuit configured to connect the AC power supply with an electronic device to allow the AC power supply supplying power to the electronic device via the control circuit, the control circuit being coupled to the switch circuit for receiving the detection signal and stopping the AC power supply from supplying power to the electronic device.

9. The identifying apparatus as claimed in claim 8, wherein the switch circuit includes a photocoupler, a transistor, and a DC power source, the converting circuit is electrically coupled to the DC power source and a gate of the transistor via the photocoupler, a source of the transistor is electrically coupled to the DC power source, a drain of the transistor is electrically coupled to the control circuit 10. The identifying apparatus as claimed in claim 8, wherein the converting circuit includes a voltage comparing circuit, a rectifier circuit, a filter circuit, and a regulator circuit, the hot line and the neutral line are electrically connected to the switch circuit via the voltage comparing circuit, the rectifier circuit, the filter circuit, and the regulator circuit in turn 11. The identifying apparatus as claimed in claim 10, wherein the voltage comparing circuit includes a first resistor, a second resistor, a third resistor, and a fourth resistor, the first and second resistors are electrically connected between the hot line and the neutral line in series, the third and fourth resistors are electrically connected between the hot line and the neutral line in series, a junction between the first and second resistors and a junction between the third and fourth resistors are electrically connected to the rectifier circuit.

12. The identifying apparatus as claimed in claim 11, wherein a resistance of the first resistor and a resistance of the fourth resistor are equal, a resistance of the second resistor and a resistance of the third resistor are equal, the resistance of the first resistor is greater than the resistance of the second resistor.

13. The identifying apparatus as claimed in claim 8, wherein the control circuit includes a relay having an inductance coil, and two single-pole double-throw (SPDT) switches, the detecting circuit is electrically coupled to one terminal of the inductance coil, the other terminal of the inductance coil is grounded, the hot line and the neutral line are electrically coupled to the corresponding power terminals of the electronic device via one contact of one of the SPDT switches and one contact of the other one of the SPUT switches respectively.

14. The identifying apparatus as claimed in claim 13, further comprising an alarm electrically coupled to the other contacts of the SPDT switchs.

15. An identifying apparatus for an electronic device which is provided with power by an alternating current (AC) power supply via a hot line and a neutral line , the identifying apparatus comprising:
 a direct current (DC) converting circuit coupled between the hot line and the neutral line for generating a DC signal if the hot line and the neutral line are swapped; and
 a switch circuit electrically connected to the converting circuit for receiving the DC signal and generating a detection signal in response to the DC signal;
 a control circuit configured to be coupled between the power supply and the electronic device, the control circuit coupled to the switch circuit for receiving the detection signal and disconnecting the electronic device from the power supply in response to the detection signal; and
 an indicator coupled to the control circuit for showing identifying result in response to the detection signal.

16. The identifying apparatus as claimed in claim 15, wherein the detecting circuit comprises a direct current (DC) converting circuit coupled between the hot line and the neutral line for generating a DC signal if the hot line and the neutral line are swapped, and a switch circuit connected to the converting circuit via a photocoupler for receiving the DC signal and generating the detection signal.

* * * * *